United States Patent [19]

Nomura

[11] Patent Number: 6,057,729
[45] Date of Patent: May 2, 2000

[54] POWER CIRCUIT

[75] Inventor: Masahiro Nomura, Tokyo, Japan

[73] Assignee: NEC Corporation, Tokyo, Japan

[21] Appl. No.: 09/094,022

[22] Filed: Jun. 9, 1998

[30] Foreign Application Priority Data

Jun. 17, 1997 [JP] Japan .................................. 9-159773

[51] Int. Cl.[7] .................................................. H03B 1/04
[52] U.S. Cl. ........................................ 327/592; 327/549
[58] Field of Search ................................. 327/538, 530, 327/592, 549, 382, 551, 362, 310

[56] References Cited

U.S. PATENT DOCUMENTS

| | | | |
|---|---|---|---|
| 3,737,757 | 6/1973 | Fowler et al. | 317/DIG. 6 |
| 4,764,736 | 8/1988 | Usui et al. | 330/294 |
| 5,506,547 | 4/1996 | Ishikawa | 332/135 |
| 5,680,106 | 10/1997 | Schrott et al. | 340/572 |
| 5,714,872 | 2/1998 | Heimerl et al. | 323/273 |
| 5,914,505 | 6/1999 | Hisada et al. | 257/207 |
| 6,005,555 | 12/1999 | Katsurahira et al. | 345/174 |

FOREIGN PATENT DOCUMENTS

| | | |
|---|---|---|
| 57-149763 | 9/1982 | Japan . |
| 60-74467 | 4/1985 | Japan . |
| 4-130659 | 5/1992 | Japan . |
| 5-28759 | 2/1993 | Japan . |
| 5-55461 | 3/1993 | Japan . |
| 6-102946 | 4/1994 | Japan . |
| 6-188323 | 7/1994 | Japan . |

*Primary Examiner*—Jung Ho Kim
*Attorney, Agent, or Firm*—Young & Thompson

[57] ABSTRACT

A power circuit for an integrated circuit chip having a plurality of operation frequency modes, the power circuit varying a resonance point defined by a parasitic resistance, inductance and capacitance existing in a power supplying line, in accordance with an operation frequency to thereby prevent the operation frequency from being in accord with a resonance frequency. For instance, when the operation frequency is relatively high, the power circuit lowers the resonance point, and when the operation frequency is relatively low, the power circuit raises the resonance point. The power circuit may further include an encoder receiving an operation frequency mode signal, and emitting an output signal indicative of an operation frequency. The power circuit provides a power ensuring stable operation of an external circuit in a plurality of operation frequency modes.

21 Claims, 15 Drawing Sheets

| OPERATION MODE SIGNAL 221 | | OPERATION FREQUENCY SIGNAL 222 | | | | | | | |
|---|---|---|---|---|---|---|---|---|---|
| IN1 | IN0 | OUT7 | OUT6 | OUT5 | OUT4 | OUT3 | OUT2 | OUT1 | OUT0 |
| HIGH SPEED | 1 | 0 | 1 | 1 | 1 | 1 | 1 | 1 | 1 | 1 |
| INTERMEDIATE SPEED | 0 | 1 | 0 | 0 | 0 | 0 | 1 | 1 | 1 | 1 |
| LOW SPEED | 0 | 0 | 0 | 0 | 0 | 0 | 0 | 0 | 0 | 1 |

| OPERATION MODE SIGNAL 221 | | OPERATION FREQUENCY SIGNAL 222 | | | | | | | |
|---|---|---|---|---|---|---|---|---|---|
| IN1 | IN0 | OUT7 | OUT6 | OUT5 | OUT4 | OUT3 | OUT2 | OUT1 | OUT0 |
| HIGH SPEED  1 | 0 | 0 | 0 | 0 | 0 | 1 | 0 | 0 | 0 |
| INTERMEDIATE SPEED  0 | 1 | 0 | 0 | 0 | 0 | 0 | 1 | 0 | 0 |
| LOW SPEED  0 | 0 | 0 | 0 | 0 | 0 | 0 | 0 | 0 | 1 |

POWER CIRCUIT

BACKGROUND OF THE INVENTION

1. Field of the Invention

The invention relates to a power circuit to be employed for an integrated circuit chip, and more particularly to a power circuit ensuring stable operation for an integrated circuit chip having a plurality of operation frequency modes.

2. Description of the Related Art

A power circuit to be employed for an integrated circuit chip has been designed to be able to suppress an oscillation of a power source voltage caused by resonant oscillation to thereby prevent malfunction in the integrated circuit chip to which power is provided from a power source through the power circuit.

FIG. 1 illustrates one of conventional power circuits. An integrated circuit chip 2201 includes an output buffer 2202 and a clock driver 2203 both of which drive a great load. The output buffer 2202 and the clock driver 2203 are connected to both a power line 2204 and a ground line 2205. Between a power source VDD and a ground GND of the integrated circuit chip 2201, there exist parasitic inductors (L) 2206 and 2207, parasitic resistors (R) 2208, 2209, 2210, 2211, 2212 and 2213, and parasitic capacitors (C) 2214, 2215, 2216 and 2217. The integrated circuit chip 2201 is designed to have an operation frequency and higher harmonics which are not in accord with a resonance point of an RLC circuit defined by the above-mentioned parasitic elements R, L and C in a power supply line. In addition, the resistors 2212 and 2213 are connected in series to the on-chip decoupling capacitors 2214 to thereby suppress a gain, which ensures a stable operation of the power circuit.

For instance, Japanese Unexamined Patent Publication No. 5-28759 published on Feb. 5, 1993 has suggested a semiconductor integrated circuit including a voltage drop circuit. The semiconductor integrated circuit is designed to have a resistance against a surge voltage applied to a Vcc pin, and include a circuit including a capacitance and a resistance connected in series to each other, between a Vcc wiring and a Vss wiring in the semiconductor integrated circuit chip, in order to suppress noises caused by fluctuation in a power source current. The capacitance positioned between the Vcc and Vss wirings delays a surge voltage applied to the Vcc pin from propagating to an internal circuit, and increases an area of PN junction connected to the Vcc wiring to thereby increase an amount of a current passing therethrough. As a result, it is possible to enhance a resistance against a surge voltage applied to the Vcc pin. The capacitance also lowers a resonance frequency defined by an inductance in a power supply line located outside the semiconductor integrated chip and a capacitance in a power supply line located inside the semiconductor integrated chip, and as a result, a great fluctuation in a power current is relaxed.

Japanese Unexamined Patent Publication No. 5-55461 published on Mar. 5, 1993 has suggested a semiconductor integrated circuit. According to this Publication, there is a problem that since a capacitor C for absorbing noises thereinto and an inductance of a lead forms a LC circuit together, when a LC resonance frequency is greater than an operation frequency of the integrated circuit by k-th times wherein k is a positive integer, an oscillation in a power voltage caused by a noise current is made higher, resulting in a malfunction of the integrated circuit. The integrated circuit is designed to include a resistor having a resistance R and connected in series to the capacitor C. The resistance R is defined as follows.

$$0.219 \times (L/C)^{1/2} \leq R < 0.431 (L/C)^{1/2}$$

Japanese Unexamined Patent Publication No. 6-188323 published on Jul. 8, 1994 has suggested a semiconductor integrated circuit device package, wherein a package is made an electrically conductive material and formed with a recess, and a resistive chip acting as a resistor to a power source is positioned in an extension of a wiring layer so that the resistive chip does not constitute a parallel resonance circuit.

Japanese Unexamined Patent Publication No. 60-74467 published on Apr. 26, 1985 has suggested a power circuit including a resistive element in a power supply line for preventing resonance. According to this Publication, the suggested power circuit makes it possible to suppress an oscillation as small as possible, which is secondarily generated when an output buffer in MOS integrated circuit is operated at a high rate, and is caused by resonance defined by capacitances located between a power source and a ground and inductances in a power supply line located outside the MOS integrated circuit, without deteriorating an operation speed of the output buffer of the MOS integrated circuit.

Japanese Unexamined Patent Publication No. 57-149763 published on Sep. 16, 1982 has suggested an integrated circuit including an impedance between a power source and a load in which a significant fluctuation in a current is generated. The impedance relaxes a fluctuation in a current in a power source terminal, caused by the significant fluctuation in a current in the load.

Japanese Unexamined Patent Publication No. 4-130659 published on May 1, 1992 has suggested a semiconductor integrated circuit including a transistor for precharging between bus lines and a higher level power supply line, and a transistor for discharging between bus lines and a lower level power supply line. The suggested semiconductor integrated circuit makes it possible to suppress a rate of change in a gate voltage in the transistor for discharging to thereby avoid GND voltage from raising.

Japanese Unexamined Patent Publication No. 6-102946 published on Apr. 15, 1994 has suggested a power circuit where a constant voltage is kept applied thereto, even if a fluctuation in a voltage is generated due to an instantaneous fluctuation in a current in the power circuit.

The above-mentioned conventional circuits have problems as follows.

The first problem is that a resistor additionally connected in series to an on-chip decoupling capacitance for preventing resonance degrades an original function of the on-chip decoupling capacitance. The reason is as follows. When charges are to be supplied through a decoupling capacitance for compensating for a voltage drop caused by switching, charges are supplied also through a resistor. Hence, if the resistor has a great resistance, charges are incompletely supplied.

The second problem is that it is quite difficult to put a resonance frequency out of an operation frequency range when an operation frequency is in a wide range, even if a power source is designed in such a manner that a resonance point is not accord with an operation frequency. This is because it would be necessary to significantly vary parasitic elements for putting a resonance point out of a wide frequency band, which is accompanied with a problem that a large area has to be prepared for arrangement of a circuit to vary parasitic elements.

SUMMARY OF THE INVENTION

In view of the foregoing problems of the conventional power circuits, it is an object of the present invention to provide a power circuit which has a small area, and which is capable of accomplishing power supply to ensure a stable operation of an integrated circuit in a plurality of operation frequency modes.

There is provided a power circuit to be employed for an integrated circuit chip having a plurality of operation frequency modes. The power circuit is designed to vary a resonance point defined by a parasitic resistance, inductance and capacitance existing in a power supplying line, in accordance with an operation frequency to prevent the operation frequency from being in accord with a resonance frequency.

For instance, when the operation frequency is relatively high, the power circuit lowers the resonance point, and when the operation frequency is relatively low, the power circuit raises the resonance point.

The power circuit may further include an operation frequency signal generation circuit which has a function of encoding, receives an operation frequency mode signal, and emits an output signal indicative of an operation frequency. It is preferable that the operation frequency signal generation circuit includes an encoder.

The power circuit may further include an operation frequency signal generation circuit which has a function of normalizing at a reference frequency, receives a reference frequency signal and an internal clock signal, and emits an output signal indicative of an operation frequency. It is preferable that the operation frequency signal generation circuit includes a combination of a shift register and a register, in which case, the combination of a shift register and a register receives the internal clock signal and the reference frequency signal, and emits an output signal indicative of a frequency of the internal clock signal. Parasitic elements are controlled in accordance with the frequency of the internal clock signal. The reference frequency signal may be designed to have a lower frequency than that of the internal clock signal.

The operation frequency signal generation circuit may be designed to include a combination of a counter and a register, in which case, the combination of a counter and a register receives the internal clock signal and the reference frequency signal, and emits an output signal indicative of a frequency of the internal clock signal, parasitic elements being controlled in accordance with the frequency of the internal clock signal.

The power circuit may further include a capacitance circuit having a capacitance varied in accordance with an operation frequency. The capacitance may be constituted of MOS transistors. For instance, the capacitance may be constituted of: a nMOS transistor having a gate terminal to which a high level voltage is applied, and source and drain terminals to each of which a low level voltage is applied; and a pMOS transistor having a gate terminal to which a low level voltage is applied, and source and drain terminals to each of which a high level voltage is applied.

As an alternative, the capacitance may be constituted of diffusion layers. For instance, the capacitance may be constituted of a p$^+$ diffusion layer formed in a n-type well and a n$^+$ diffusion layer formed in a p-type well, a high level voltage being applied to the n$^+$ diffusion layer and the n-type well, a low level voltage being applied to the p$^+$ diffusion layer and the p-type well.

The capacitance may be constituted of wiring layers. For instance, the capacitance is constituted of a first wiring layer formed on a p- or n-type region, and a second wiring layer formed on the first wiring layer, a high level voltage being applied to both the p- or n-type region and the second wiring layer, a low level voltage being applied to the first wiring layer.

The power circuit may further include an inductance circuit having an inductance varied in accordance with an operation frequency.

The power circuit may further include a resistor circuit having a resistance varied in accordance with an operation frequency, in which case, the resistor may be constituted of MOS transistors, at least one polysilicon layer, or diffusion layers.

A power circuit in accordance with the present invention is designed to vary a resonance point in a power supply line in accordance with an operation frequency thereof.

In a power supply line, there is formed a RLC resonance circuit defined by parasitic resistances, parasitic inductances and parasitic capacitances of a package, a bonding wire, an on-chip decoupling capacitance, a wiring for transmitting power therethrough, and a dumping resistance. The RLC resonance circuit has a resonance point. The number of power source pins, an on-chip capacitance, and a dumping resistance in a conventional resonance circuit has been determined in such a manner that a resonance point is not accord with operation frequencies of an output buffer, a clock driver, and so on. As well as doing so, the power circuit in accordance with the present invention is designed to vary a resonance point in accordance with the operation frequencies. For instance, when an operation frequency is relatively high, capacitance and inductance elements are raised to thereby lower a resonance point, and when an operation frequency is relatively low, capacitance and inductance elements are lowered to thereby raise a resonance point. In such a manner, a resonance point is varied in accordance with an operation frequency.

In a conventional power circuit, a resistor connected in series to a capacitance has been designed to have a great resistance value in order to lower a gain at a resonance point. However, if a gain is lowered without any countermeasure, the decoupling effect is also deteriorated, though an on-chip capacitance is incorporated into a power circuit for the purpose of enhancing the decoupling effect. To solve this problem, the power circuit in accordance with the present invention is designed to have a resistor connected in series to a decoupling capacitance and having a resistance as small as possible.

In accordance with the present invention, what is necessary to do is to move a resonance point only in an operation frequency mode required to do so. It is not necessary to move a resonance point in all operation frequency bands for a plurality of operation frequency modes. In addition, it would be possible to suppress a gain by means of a resistive element with respect to a frequency where a resonance point is not adequately moved and a frequency where a problem of higher harmonics is caused, ensuring stable power supply in a high efficient.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1:
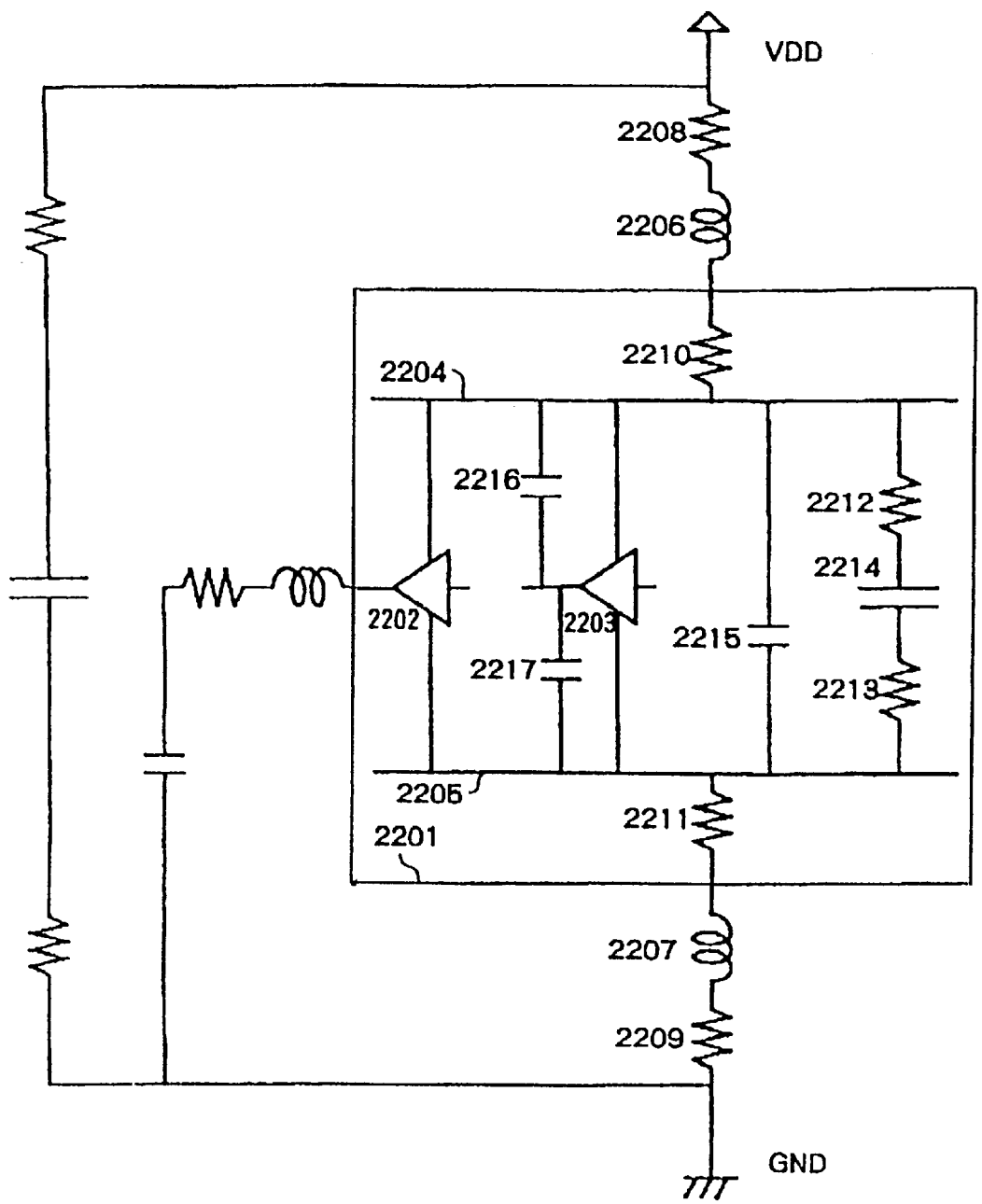
FIG. 1 is a circuit diagram of a conventional power circuit.
Figure 2:
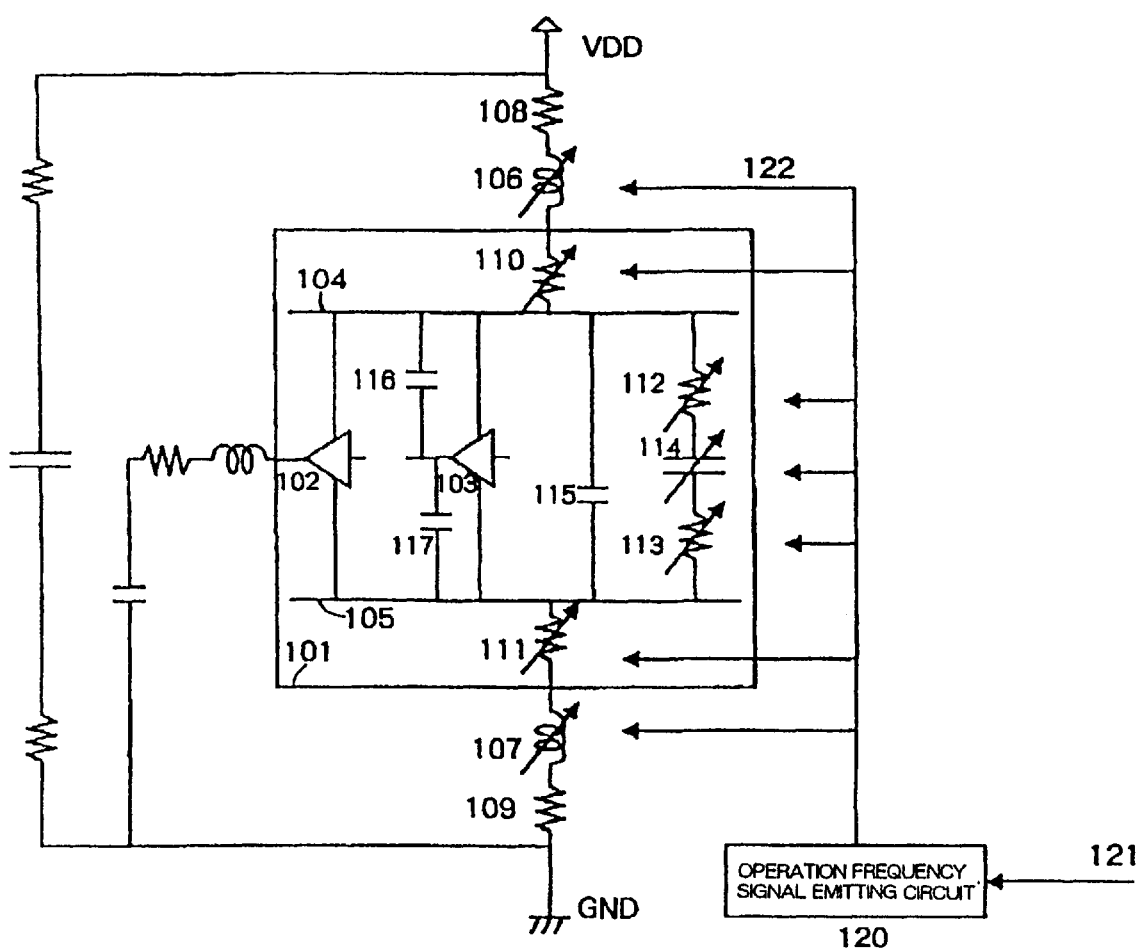
FIG. 2 is a circuit diagram of a power circuit in accordance with the first embodiment of the present invention.

FIG. 2 is a circuit diagram of a power circuit in accordance with the first embodiment of the present invention. An integrated circuit chip 101 includes an output buffer 102 and a clock driver 103 both of which drive a great load. The output buffer 102 and the clock driver 103 are connected to both a power line 104 and a ground line 105. Between a power source VDD and a ground GND of the integrated circuit chip 101, there exist parasitic inductors (L) 106 and 107, parasitic resistors (R) 108, 109, 110, 111, 112 and 113, parasitic capacitors (C) 114, 115, 116 and 117.

A circuit 120 for emitting an operation frequency signal receives an operation mode signal or a clock signal and a reference frequency signal as input signals, and emits an operation frequency signal 122 as an output signal. The above-mentioned parasitic elements RLC in a power supply line are varied in accordance with the operation frequency signal 122, and as a result, a resonance point in an RLC circuit defined with the above-mentioned parasitic elements RLC is moved, and a gain is controlled. By moving a resonance point, it is possible to avoid an operation frequency from being in accord with a resonance frequency, and by controlling a gain, it is possible to suppress a resonance of the power circuit, ensuring a stable operation.

Figures 3, 4:
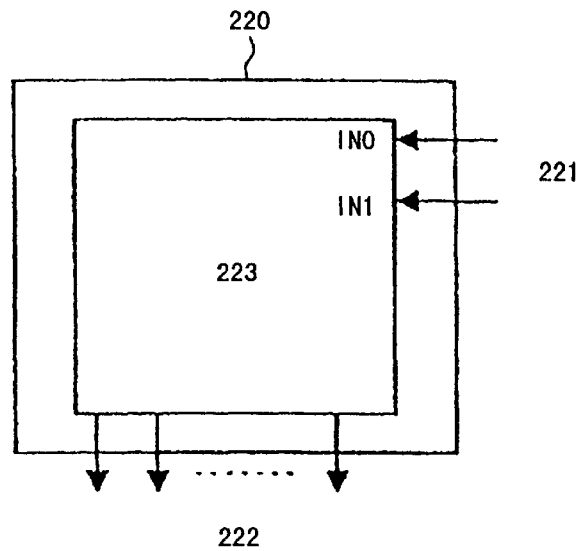
FIG. 3 is a circuit diagram of an operation frequency signal generation circuit including an encoder, employed in a power circuit in accordance with the first embodiment.
FIG. 4 illustrates an example of encoding to be carried out by the operation frequency signal generation circuit illustrated in FIG. 3.

FIG. 3 illustrates an example of the operation frequency signal generation circuit 120. An illustrated operation frequency signal generation circuit 220 is designed to include an encoder 223. The operation frequency signal generation circuit 220 receives operation mode signals 221 indicative of an operation frequency of an integrated circuit chip, and emits operation frequency signals 222 to be used for controlling parasitic elements in accordance with the operation frequency. The operation frequency signals 222 are signals encoded by the encoder 223.

FIG. 4 shows an example of a function of the encoder 223, and further an example of a relation between the operation mode signal 221 as an input and the operation frequency signal 222 as an output. The operation mode signal 221 is input into the encoder 223 at two bits IN 1 and IN 0, and the operation frequency signal 222 is output from the encoder 223 at eight bits OUT 7, OUT 6, OUT 5, OUT 4, OUT 3, OUT 2, OUT 1 and OUT 0. When the operation mode signals 221 (IN 1, IN 0) constitute two bit signals (1, 0), (0, 1) and (0, 0), they indicate a high, intermediate, and low speed, respectively, and the operation frequency signals 222 constitute eight bit signals (1, 1, 1, 1, 1, 1, 1, 1), (0, 0, 0, 0, 1, 1, 1, 1) and (0, 0, 0., 0, 0, 0, 0, 1), respectively. The output signals 222 are encoded in such a manner that the number of ones (1) is increased from a lower bit as an operation frequency is increased. This encoding is effective when a circuit to be controlled does not have a weight.

Figures 5, 6:
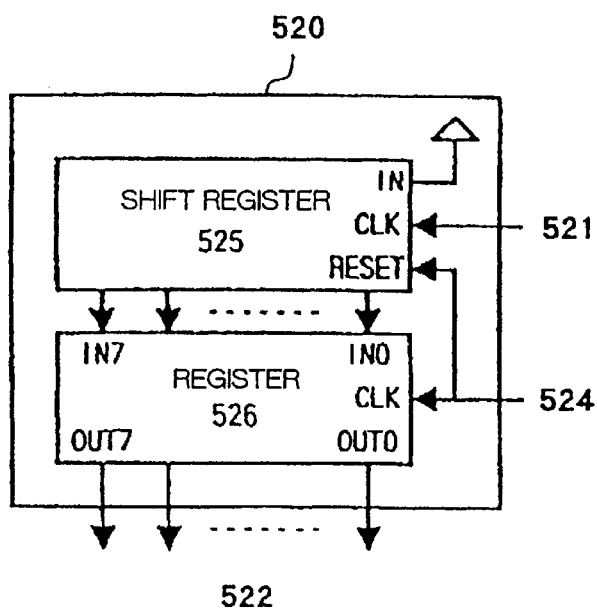
FIG. 5 illustrates another example of encoding to be carried out by the operation frequency signal generation circuit illustrated in FIG. 3.
FIG. 6 is a circuit diagram of an operation frequency signal generation circuit including a shift register and a register, employed in a power circuit in accordance with the second embodiment.

FIG. 5 shows another example of a function of the encoder 223, and further another example of a relation between the operation mode signal 221 as an input and the operation frequency signal 222 as an output. The operation mode signal 221 is input into the encoder 223 at two bits IN 1 and IN 0, and the operation frequency signal 222 is output from the encoder 223 at eight bits OUT 7, OUT 6, OUT 5, OUT 4, OUT 3, OUT 2, OUT 1 and OUT 0. When the operation mode signals 221 (IN 1, IN 0) constitute two bit signals (1, 0), (0, 1) and (0, 0), they indicate a high, intermediate, and low speed, respectively, and the operation frequency signals 222 constitute eight bit signals (0, 0, 0, 0, 1, 0, 0, 0), (0, 0, 0, 0, 0, 1, 0, 0) and (0, 0, 0, 0, 0, 0, 0, 1), respectively. The output signals 222 are encoded in such a manner that a one (1) is included at a higher bit as an operation frequency becomes higher. The one (1) in FIG. 4 is represented with binary number system. This encoding is effective when a circuit to be controlled has a weight, and makes it possible to decrease the number of output bits in the operation frequency signal 222 relative to the example shown in FIG. 4.

[Second Embodiment]

FIG. 6 illustrates an operation frequency signal generation circuit 520 to be employed in a power circuit in accordance with the second embodiment. The operation frequency signal generation circuit 520 includes a shift register 525 and a register 526. The shift register 525 receives a power supply as a shift input, an internal clock signal 521 as a clock input, and a reference frequency signal 524 as a reset input. The register 526 receives a reference frequency signal 524 as a clock input. The reference frequency signal 524 is designed to have a lower frequency than that of the internal clock signal 521.

The operation frequency signal generation circuit 520 comprised of a combination of the shift register 525 and the register 526 receives the internal clock signal 521 and the reference frequency signal 524, detects a frequency of the internal clock signal 521, and emits operation frequency signals 522 by which parasitic elements are controlled in accordance with the frequency of the internal clock signal 521. The operation frequency signals 522 are encoded in such a manner that the number of ones (1) is increased from a lower bit as the frequency is increased in the same way as the encoding shown in FIG. 4.

Figure 7:
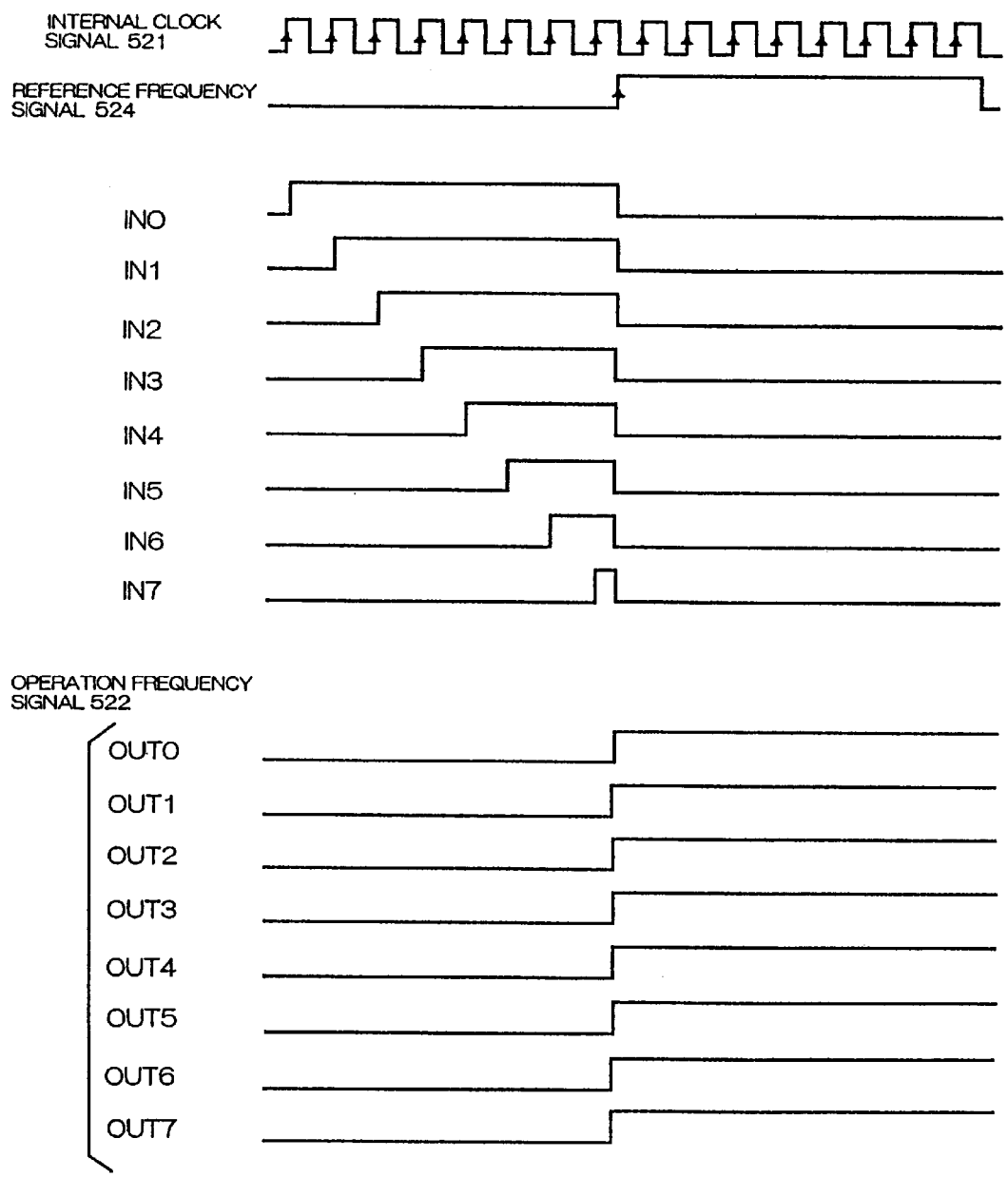
FIG. 7 is a timing chart of the operation frequency signal generation circuit illustrated in FIG. 6.

FIG. 7 is a timing chart showing an operation of the operation frequency signal generation circuit 520. The shift register 525 operates at leading edge. The shift register 525 emits outputs IN 0, IN 1, IN 2, IN 3, IN 4, IN 5, IN 6 and IN 7 where figure one (1) is established from a lower bit each time the internal clock signal 521 varies, when the reference frequency signal 524 represents zero (0).

The register 526 is comprised of a leading edge trigger flip-flop, and latches an output emitted from the shift register 525 just when the reference frequency signal 524 rises up. In the illustrated example, the operation frequency signals 522 are all turned to one (1).

As mentioned earlier, the reference frequency signal 524 is introduced into the shift register 525 at a reset input thereof. The shift register 525 is reset after the operation frequency signal 522 is latched at the register 526. In the example illustrated in FIGS. 6 and 7, the shift register 525 makes shifts at the same number as the number by which the internal clock signal 521 varies while the reference frequency signal 524 represents zero (0). Hence, it is necessary to set the number of bits of the shift register 525 and the register 526 to be equal to the number by which the internal clock signal 521 varies in a high frequency operation mode in a half period of the reference frequency signal 524.

[Third Embodiment]

Figure 8:
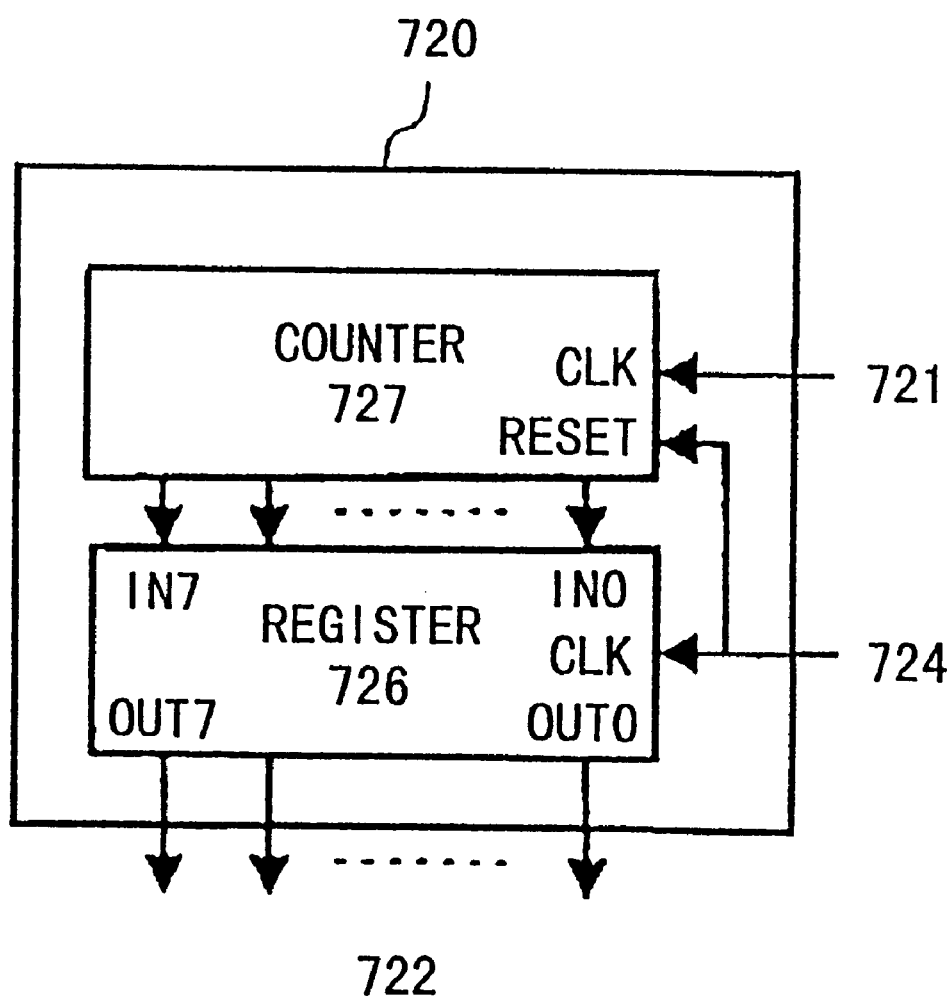
FIG. 8 is a circuit diagram of an operation frequency signal generation circuit including a counter and a register, employed in a power circuit in accordance with the third embodiment.

FIG. 8 illustrates an operation frequency signal generation circuit 720 to be employed in a power circuit in accordance with the third embodiment. The operation frequency signal generation circuit 720 includes a counter 727 and a register 726. The counter 727 receives an internal clock signal 721 as a clock input, and a reference frequency signal 724 as a reset input. The register 726 receives a reference frequency signal 724 as a clock input. The reference frequency signal 724 is designed to have a lower frequency than that of the internal clock signal 721.

The operation frequency signal generation circuit 720 comprised of a combination of the counter 727 and the register 726 receives the internal clock signal 721 and the reference frequency signal 724, detects a frequency of the internal clock signal 721, and emits operation frequency signals 722 by which parasitic elements are controlled in accordance with the frequency of the internal clock signal 721. The operation frequency signals 722 are encoded in binary number system.

Figure 9:
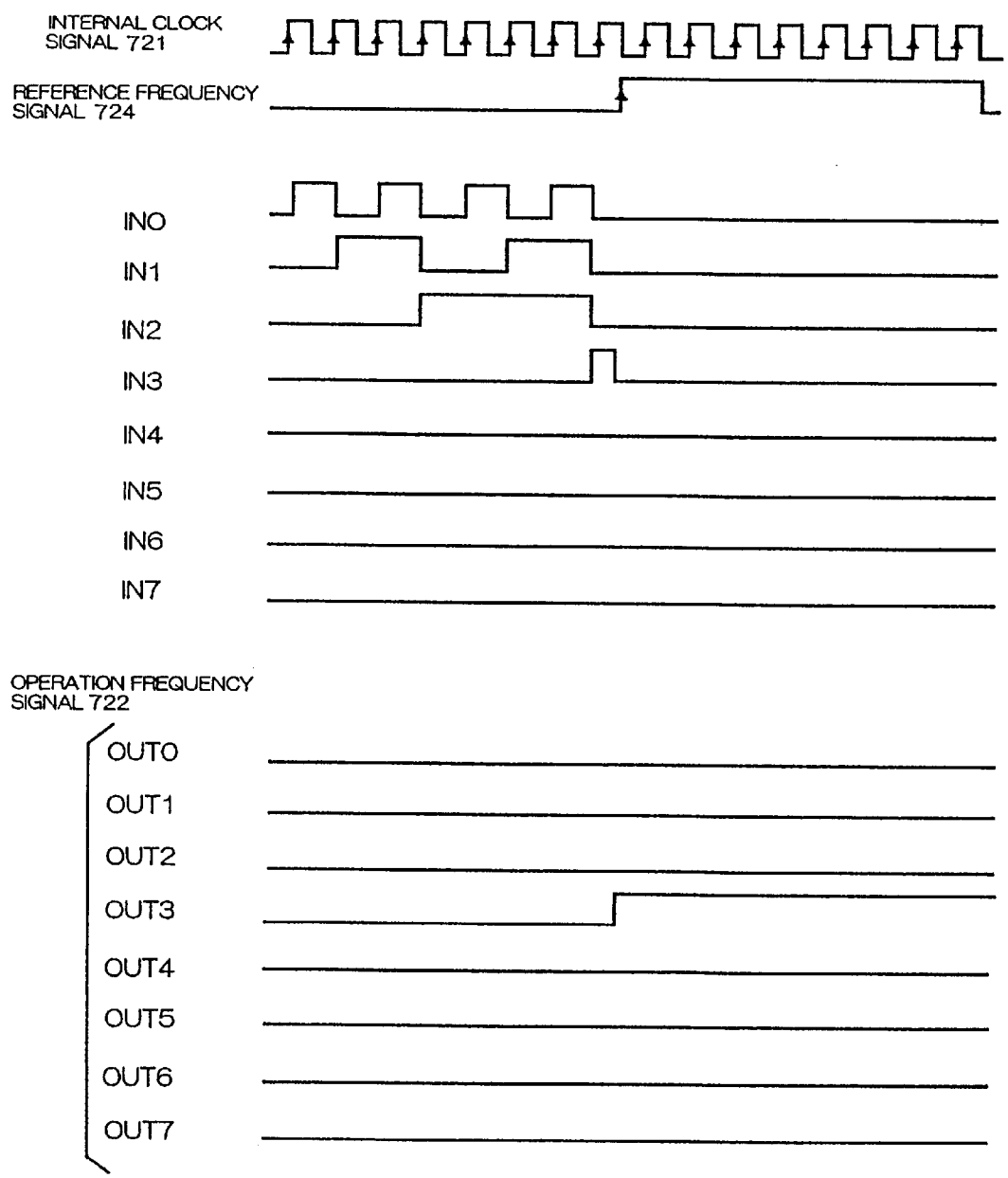
FIG. 9 is a timing chart of the operation frequency signal generation circuit illustrated in FIG. 8.

FIG. 9 is a timing chart showing an operation of the operation frequency signal generation circuit 720. The counter 727 counts the internal clock signals 721, and emits outputs IN 0, IN 1, IN 2, IN 3, IN 4, IN 5, IN 6 and IN 7 where count-up is made in binary number system each time the internal clock signal 721 varies, when the reference frequency signal 724 represents zero (0).

The register 726 is comprised of a leading edge trigger flip-flop, and latches an output emitted from the counter 727 just when the reference frequency signal 724 rises up. In the illustrated example, the operation frequency signals 722 is turned to one (1) at OUT 3.

As mentioned earlier, the reference frequency signal 724 is introduced into the counter 727 at a reset input thereof. The counter 727 is reset after the operation frequency signal 722 is latched at the register 726. In the example illustrated in FIGS. 8 and 9, count-up is made by the same number as the number by which the internal clock signal 721 varies while the reference frequency signal 724 represents zero (0). Hence, it is necessary to set the number of bits of the counter 727 and the register 726 to be equal to the number by which the internal clock signal 721 varies in a high frequency operation mode in a half period of the reference frequency signal 724.

[Fourth Embodiment]

Figure 10:
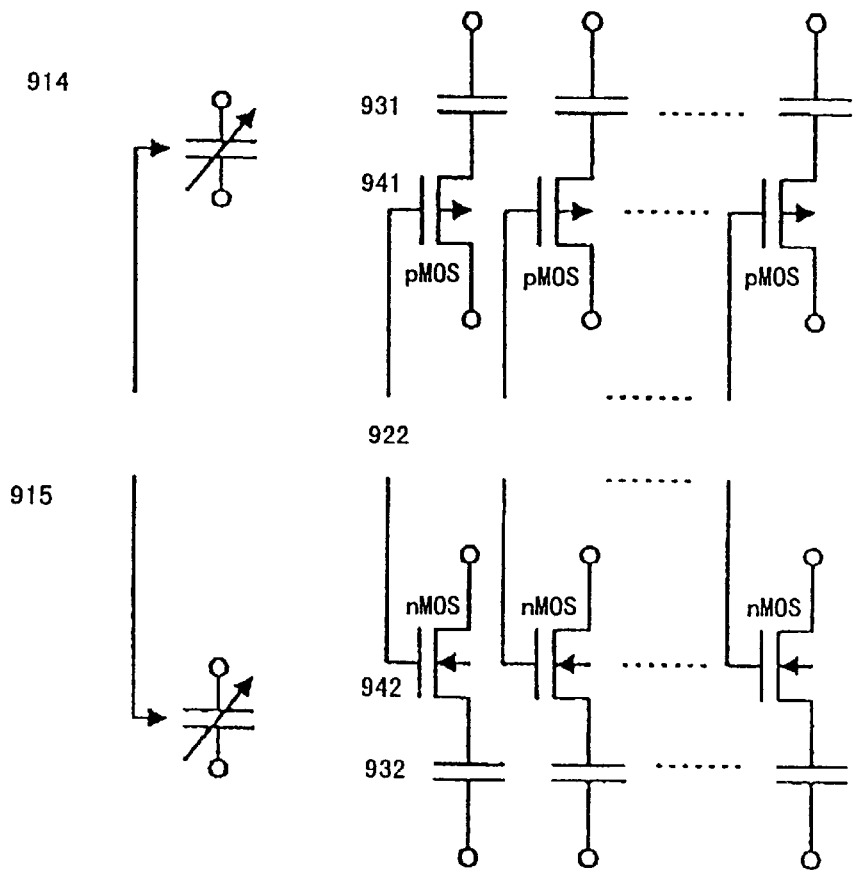
FIG. 10 is a circuit diagram of a circuit for varying a capacitance, to be employed in a power circuit in accordance with the fourth embodiment.

FIG. 10 illustrates a circuit for varying a capacitance to be employed in a power circuit in accordance with the fourth embodiment of the present invention. The illustrated capacitance varying circuits 914 and 915 are equivalent to the on-chip decoupling capacitance 114, and parasitic capacitance 115 illustrated in FIG. 2. The capacitance varying circuits 914 and 915 vary a capacitance to thereby move a resonance point. The illustrated capacitance varying circuit 914 is comprised of a plurality of pMOS transistors 941, and a plurality of capacitors 931 each of which is connected in series to each of the pMOS transistors 941. The illustrated capacitance varying circuit 915 is comprised of a plurality of nMOS transistors 942, and a plurality of capacitors 932 each of which is connected in series to each of the nMOS transistors 942. An operation frequency signal 922 is introduced into gates of each of the pMOS transistors 941 and the nMOS transistor 942. The pMOS and nMOS transistors 941 and 942 act as a switch.

It would be possible to obtain a desired capacitance by introducing the operation frequency signals 922 into a certain number of the transistors to thereby turn on the transistors at the desired number. As an alternative, it would be also possible to reduce the number of signal lines by varying a weight of capacitances to thereby provide a weight to the operation frequency signals 922.

Figure 11:
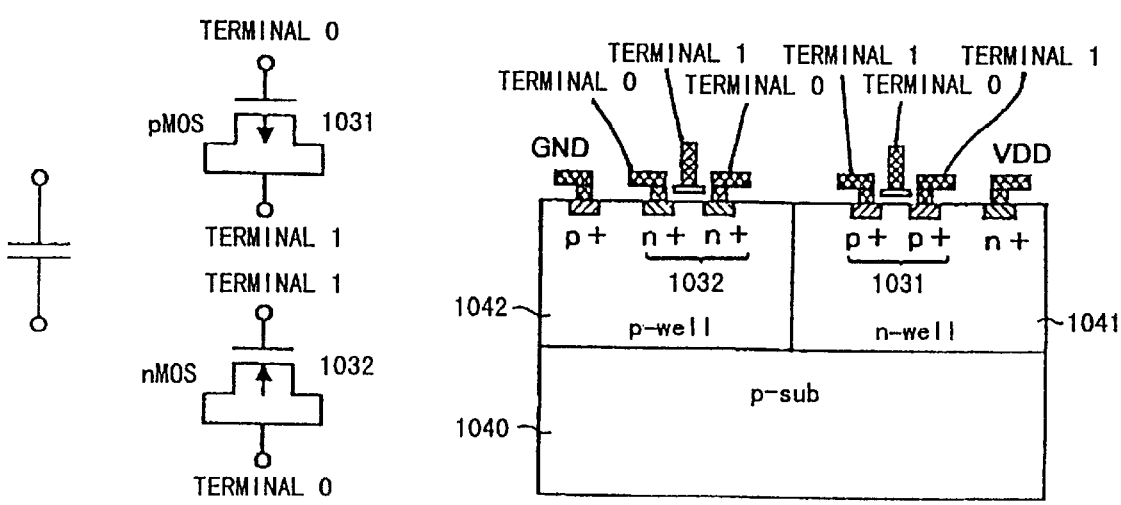
FIG. 11 is a circuit diagram of a MOS capacitance circuit to be employed in a power circuit in accordance with the fourth embodiment.
Figure 12:
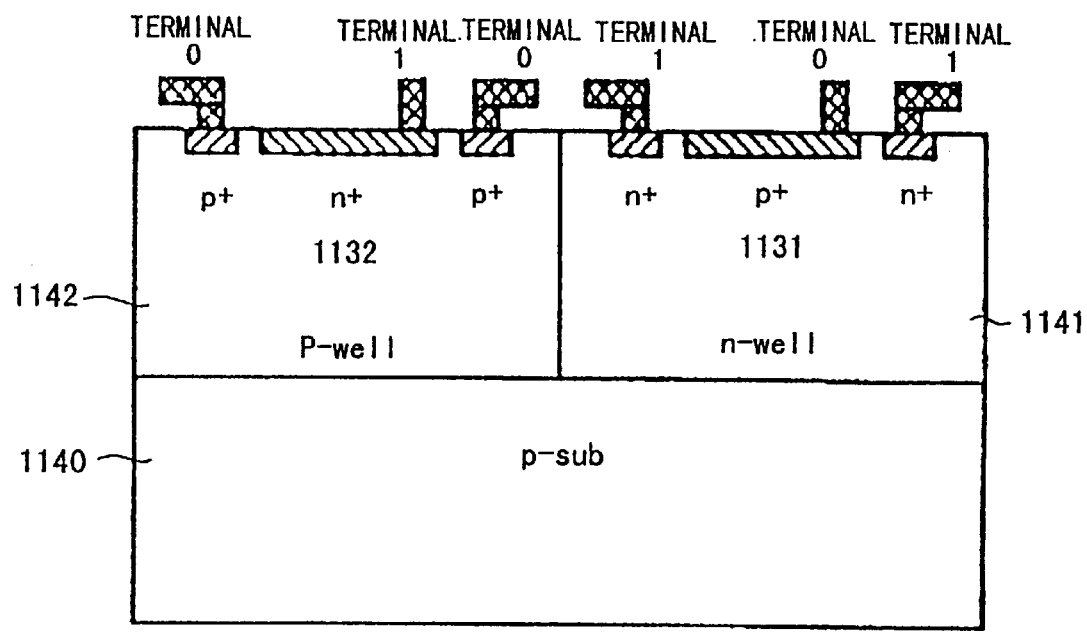
FIG. 12 is a circuit diagram of a diffusion capacitance circuit to be employed in a power circuit in accordance with the fourth embodiment.
Figure 13:
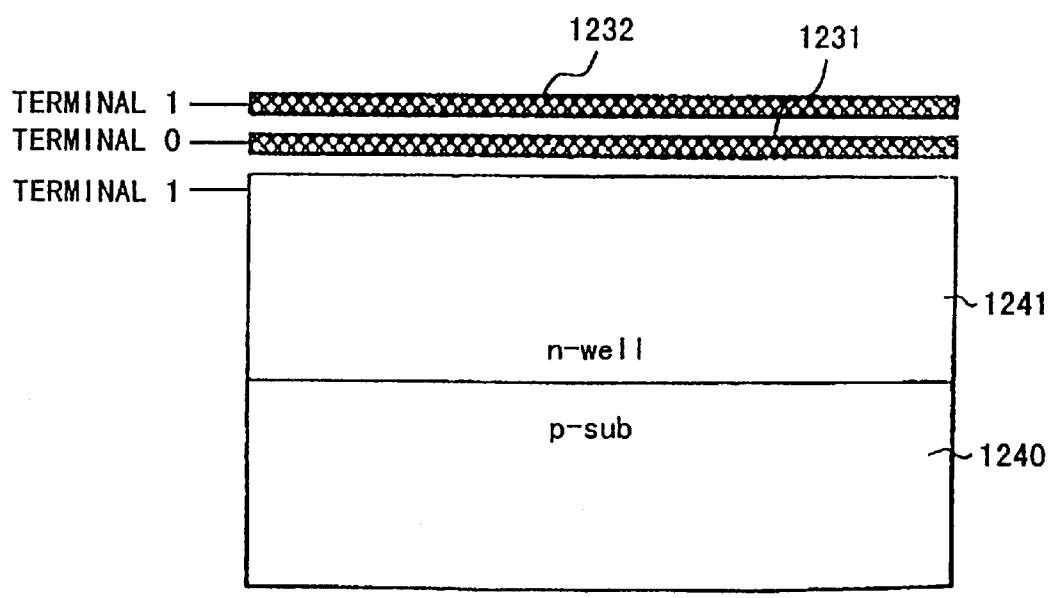
FIG. 13 is a circuit diagram of a wiring capacitance circuit to be employed in a power circuit in accordance with the fourth embodiment.

FIGS. 11, 12 and 13 illustrate examples of the capacitance varying circuit.

FIG. 11 illustrates a capacitance varying circuit in which a capacitance is constituted of a pMOS transistor 1031 and a nMOS transistor 1032. As illustrated, a p-type semiconductor substrate 1040 includes a n-type well 1041 and a p-type well 1042. In the n-type well 1041, there are formed two $p^+$ regions as source and drain regions both of which constitute the pMOS transistor 1031 together with a gate, and a $n^+$ region through which the n-type well 1041 is electrically connected to a power source VDD. In the p-type well 1042, there are formed two $n^+$ regions as source and drain regions both of which constitute the nMOS transistor 1032 together with a gate, and a $p^+$ region through which the p-type well 1042 is electrically connected to a ground GND.

A terminal 0 indicates a terminal electrically connected to a lower level voltage, and a terminal 1 indicates a terminal electrically connected to a high level voltage. In the nMOS transistor 1032, the terminal 1 is connected to a gate terminal, and the terminals 0 are connected to source and drain terminals. In the pMOS transistor 1031, the terminal 0 is connected to a gate terminal, and the terminals 1 are connected to source and drain terminals.

FIG. 12 illustrates a capacitance varying circuit in which a capacitance is constituted of diffusion layers. As illustrated, a p-type semiconductor substrate 1140 includes a n-type well 1141 and a p-type well 1142. In the n-type well 1141, there are formed two $n^+$ regions as n-well contacts, and a $p^+$ diffusion region 1131 between the $n^+$ regions. In the p-type well 1142, there are formed two $p^+$ regions as p-well contacts, and a $n^+$ diffusion region 1132 between the $p^+$ regions.

A terminal 0 indicates a terminal electrically connected to a lower level voltage, and a terminal 1 indicates a terminal electrically connected to a high level voltage. In the n-well 1141, the terminal 0 is connected to the $p^+$ diffusion region 1131, and the terminals 1 are connected to the $n^+$ diffusion regions. In the p-well 1142, the terminal 1 is connected to the $n^+$ diffusion region 1132, and the terminals 0 are connected to the $p^+$ diffusion regions. In this example, since there is employed the p-type substrate 1140, the p-type well 1142 has the same voltage as that of the p-type substrate 1140. Hence, it is necessary to set the terminal 0 to have a ground voltage.

FIG. 13 illustrates a capacitance varying circuit in which a capacitance is constituted of wiring layers. As illustrated, the capacitance varying circuit is comprised of a p-type substrate 1240 including an n-type well 1241 on which first and second wiring layers 1231 and 1232 are formed.

A terminal 0 indicates a terminal electrically connected to a lower level voltage, and a terminal 1 indicates a terminal electrically connected to a high level voltage. The first wiring layer 1231 is electrically connected to the terminal 0, and the second wiring layer 1232 and the n-type well 1241 are both electrically connected to the terminal 1. This example provides a capacitance having a sandwiched structure.

Figure 14A:
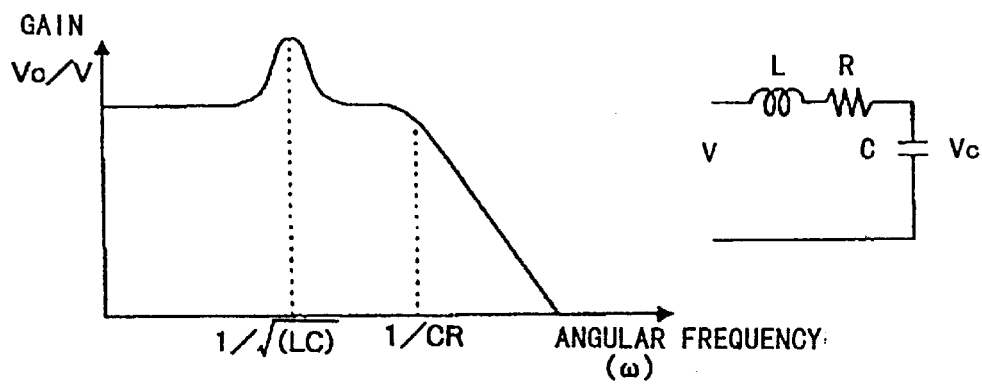
FIGS. 14A, 14B and 14C illustrate characteristics of a frequency dependent on a capacitance in a RLC circuit.
Figure 14B:
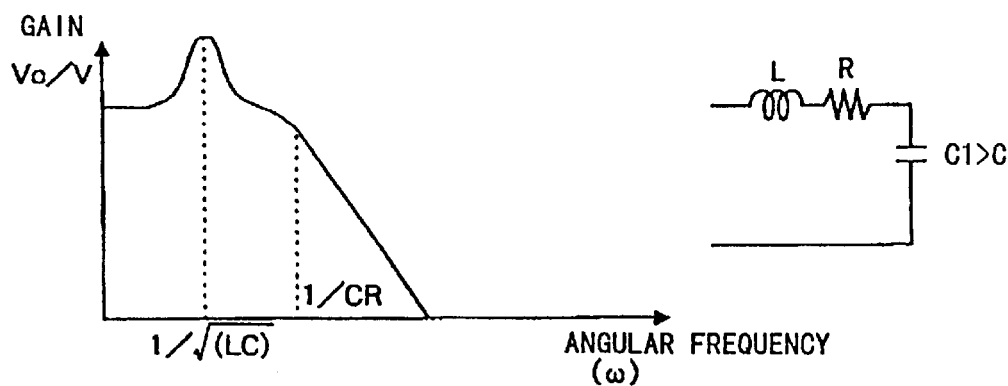
Figure 14C:
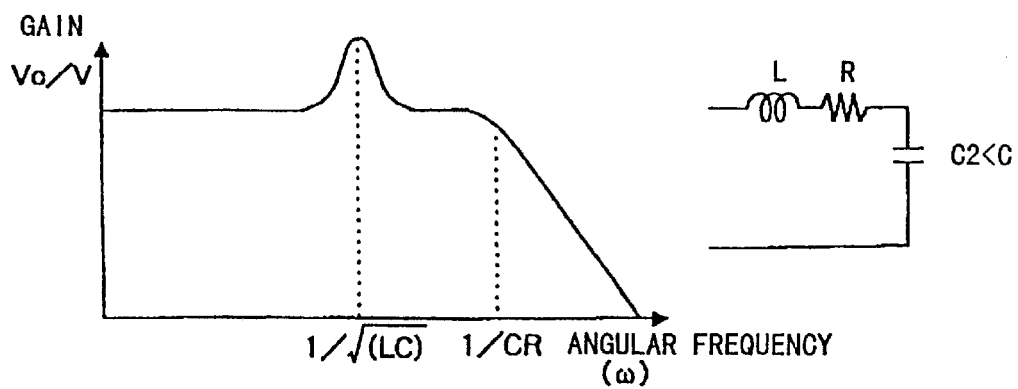

FIGS. 14A, 14B and 14C illustrate a frequency characteristic dependent on a capacitance in an RLC circuit. A curve representing the frequency characteristic has a resonance point when an angular frequency $\omega$ is equal to $1/(LC)^{1/2}$, and has a peak at the resonance point. The curve is attenuated in a range where an angular frequency $\omega$ is greater than $1/CR$ ($\omega > 1/CR$).

FIG. 14A shows a frequency characteristic of an RLC circuit including a capacitance C.

FIG. 14B shows a frequency characteristic of an RLC circuit including a capacitance C1 greater than the capacitance C of the circuit illustrated in FIG. 14A. As shown in the curve illustrated in FIG. 14B in comparison with FIG. 14A, if an RLC circuit is designed to include a greater capacitance, a resonance point thereof appears at a lower angular frequency, and a cut-off angular frequency is also lowered.

FIG. 14C shows a frequency characteristic of an RLC circuit including a capacitance C2 smaller than the capacitance C of the circuit illustrated in FIG. 14A. As shown in the curve illustrated in FIG. 14C in comparison with FIG. 14A, if an RLC circuit is designed to include a smaller capacitance, a resonance point thereof appears at a higher angular frequency, though a cut-off angular frequency is also raised.

[Fifth Embodiment]

Figure 15A:
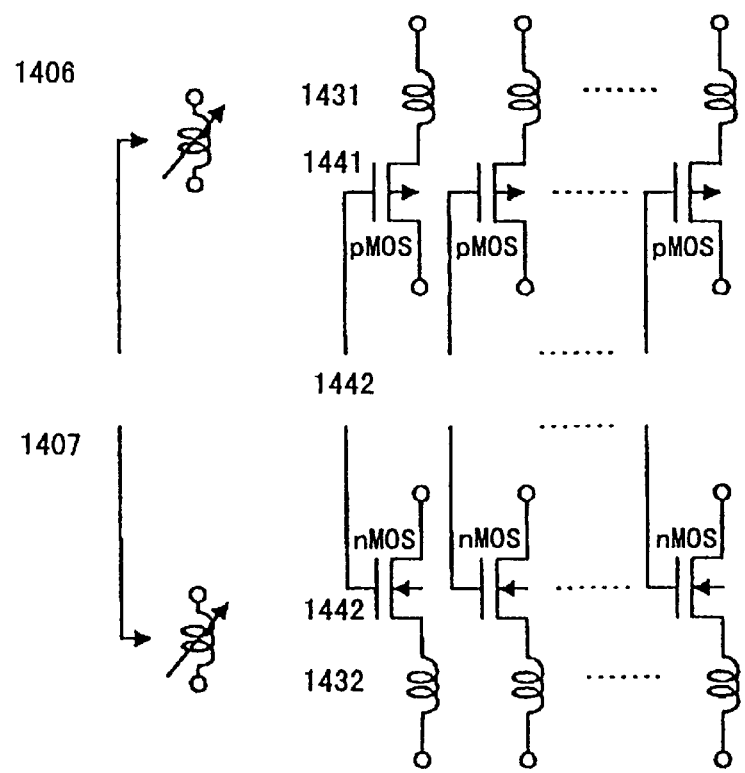
FIGS. 15A and 15B are circuit diagrams of a circuit for varying an inductance, to be employed in a power circuit in accordance with the fifth embodiment.
Figure 15B:
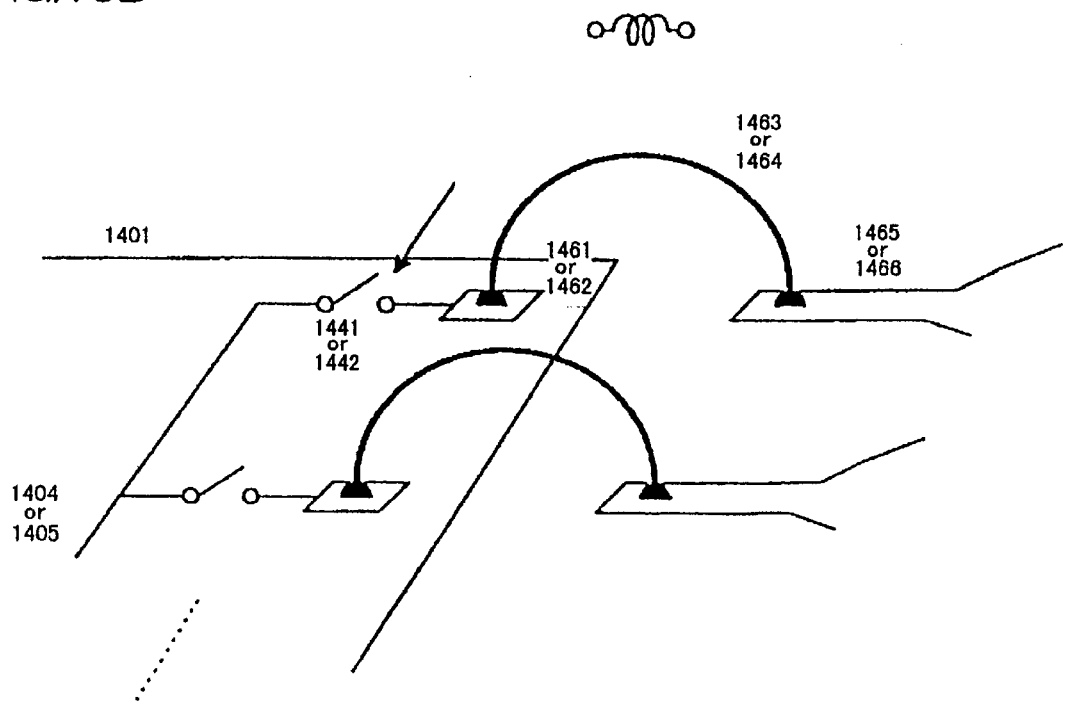

FIGS. 15A and 15B illustrate a circuit for varying an inductance, to be employed in a power circuit in accordance with the fifth embodiment of the present invention. The illustrated inductance varying circuits 1406 and 1407 are equivalent to the parasitic inductances 106 and 107 illustrated in FIG. 2. The inductance varying circuits 1046 and 1047 vary an inductance to thereby move a resonance point, though a high inductance in a power supply line is not preferable, because an inductance acts as a high impedance to a high frequency current.

The illustrated inductance varying circuit 1406 is comprised of a plurality of pMOS transistors 1441, and a plurality of coils 1431 each of which is connected in series to each of the pMOS transistors 144. The illustrated inductance varying circuit 1407 is comprised of a plurality of nMOS transistors 1442, and a plurality of coils 1432 each of which is connected in series to each of the nMOS transistors 1442. An operation frequency signal 1422 is introduced into gates of each of the pMOS transistors 1441 and the nMOS transistor 1442. The pMOS and nMOS transistors 1441 and 1442 act as a switch.

As illustrated in FIG. 15B, a power supply terminal 1465 of a package is electrically connected to a power supply pad 1461 through a bonding wire 1463, and a ground terminal 1466 of a package is electrically connected to a ground pad 1464 through a bonding wire 1464. The power supply terminal 1461 is electrically connected to an internal power supply terminal 1404 through a switching transistor 1441, and the ground terminal 1462 is electrically connected to an internal ground terminal 1405 through a switching transistor 1442.

It would be possible to obtain a desired inductance by introducing the operation frequency signals 1422 into a certain number of power supply ground pins. As an alternative, it would be also possible to reduce the number of signal lines by varying a weight of inductances to thereby provide a weight to the operation frequency signals 1422.

Figure 16A:
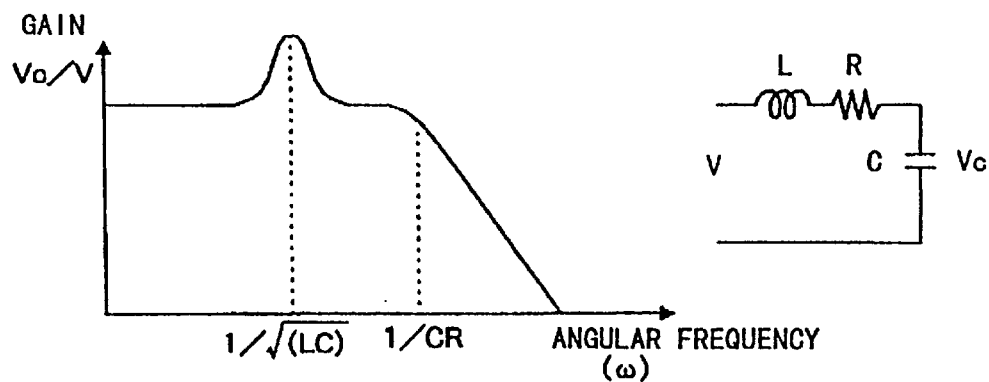
FIGS. 16A, 16B and 16C illustrate characteristics of a frequency dependent on an inductance in a RLC circuit.
Figure 16B:
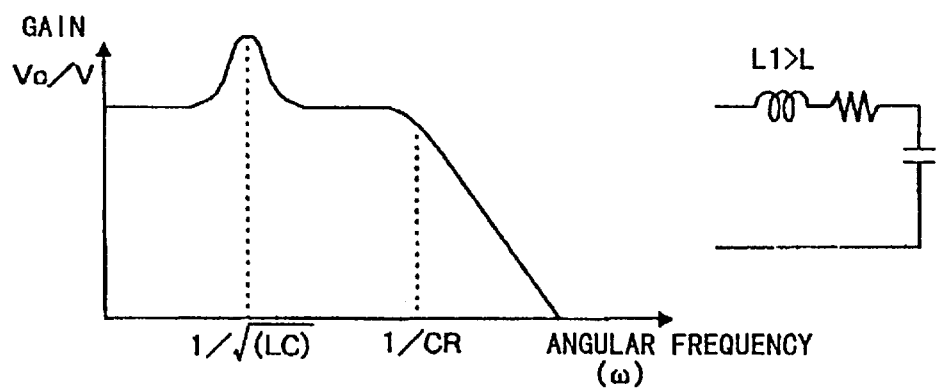
Figure 16C:
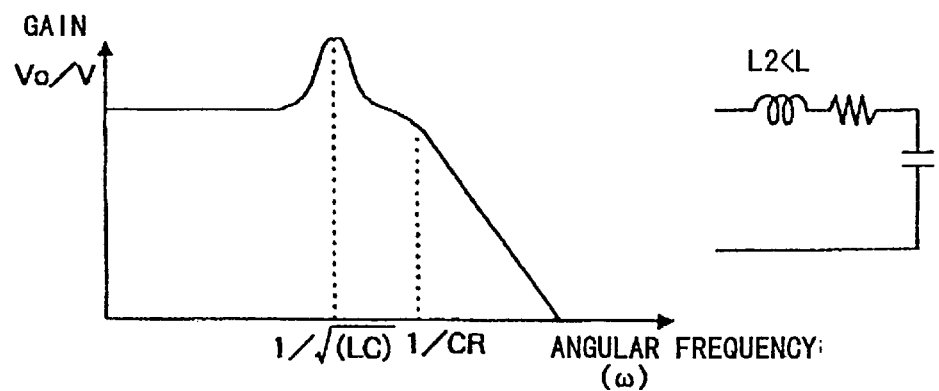

FIGS. 16A, 16B and 16C illustrate a frequency characteristic dependent on an inductance in an RLC circuit. A curve representing the frequency characteristic has a resonance point when an angular frequency $\omega$ is equal to $1/(LC)^{1/2}$, and has a peak at the resonance point. The curve is attenuated in a range where an angular frequency $\omega$ is greater than $1/CR$ ($\omega > 1/CR$).

FIG. 16A shows a frequency characteristic of an RLC circuit including an inductance L.

FIG. 16B shows a frequency characteristic of an RLC circuit including an inductance L1 greater than the inductance L of the circuit illustrated in FIG. 16A. As shown in the curve illustrated in FIG. 16B in comparison with FIG. 16A, if an RLC circuit is designed to include a greater inductance, a resonance point thereof appears at a lower angular frequency.

FIG. 16C shows a frequency characteristic of an RLC circuit including an inductance L2 smaller than the inductance L of the circuit illustrated in FIG. 16A. As shown in the curve illustrated in FIG. 16C in comparison with FIG. 16A, if an RLC circuit is designed to include a smaller inductance, a resonance point thereof appears at a higher angular frequency.

The number of power supply pins are usually set to be maximized in order to avoid a voltage drop caused by an inductance.

[Sixth Embodiment]

Figure 17:
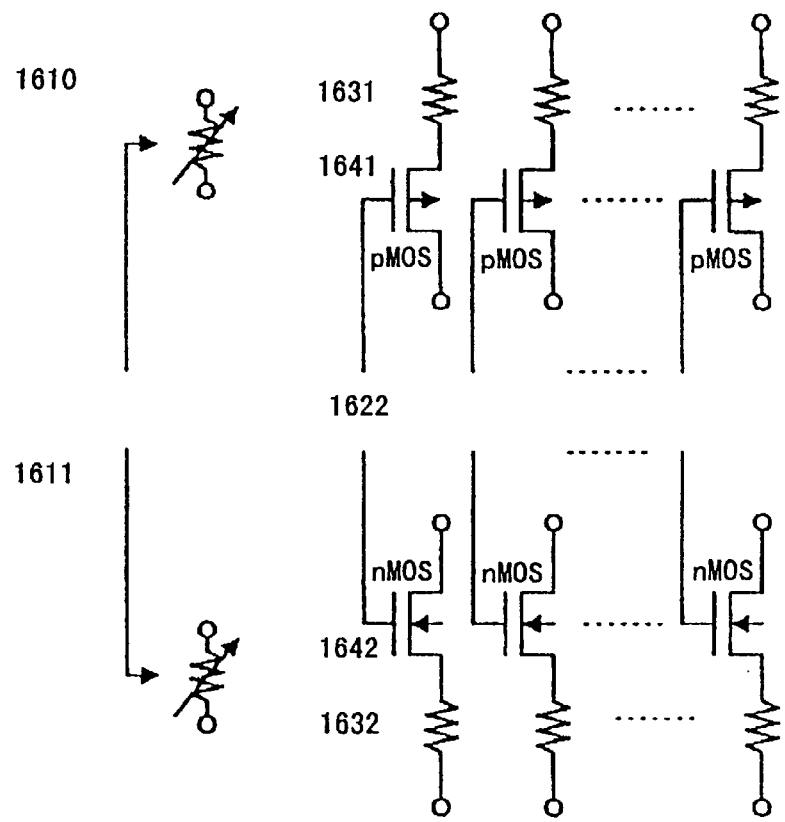
FIG. 17 is a circuit diagram of a circuit for varying a resistance, to be employed in a power circuit in accordance with the sixth embodiment.

FIG. 17 illustrates a circuit for varying a resistance, to be employed in a power circuit in accordance with the sixth embodiment of the present invention. The illustrated resistance varying circuits 1610 and 1611 are equivalent to the parasitic resistances 110, 111, 112 and 113 illustrated in FIG. 2. The resistance varying circuits 1610 and 1611 vary a resistance to thereby vary a cut-off frequency.

The illustrated resistance varying circuit 1610 is comprised of a plurality of pMOS transistors 1641, and a plurality of resistors 1631 each of which is connected in series to each of the PMOS transistors 1641. The illustrated resistance varying circuit 1611 is comprised of a plurality of nMOS transistors 1642, and a plurality of resistors 1632 each of which is connected in series to each of the nMOS transistors 1642. An operation frequency signal 1622 is introduced into gates of each of the pMOS transistors 1641 and the nMOS transistor 1642. The pMOS and nMOS transistors 1641 and 1642 act as a switch.

It would be possible to obtain a desired resistance by introducing the operation frequency signals 1622 into a certain number of transistors to thereby turn on. As an alternative, it would be also possible to reduce the number of signal lines by varying a weight of resistances to thereby provide a weight to the operation frequency signals 1622.

When a resistance is connected in series to a power supply terminal and a ground terminal in an internal circuit, there is generated a voltage drop. To the contrary, when a resistance is connected in series not to a power supply terminal and a ground terminal, but to a decoupling capacitance, the decoupling effect is reduced.

Figure 18:
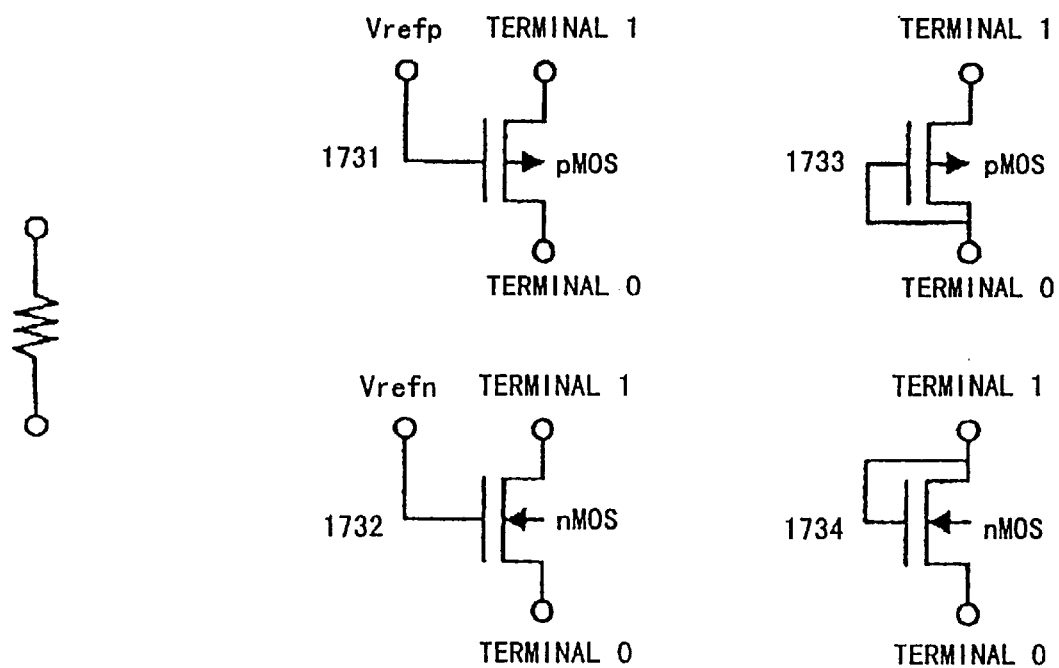
FIG. 18 is a circuit diagram of a MOS resistor circuit.
Figure 19:
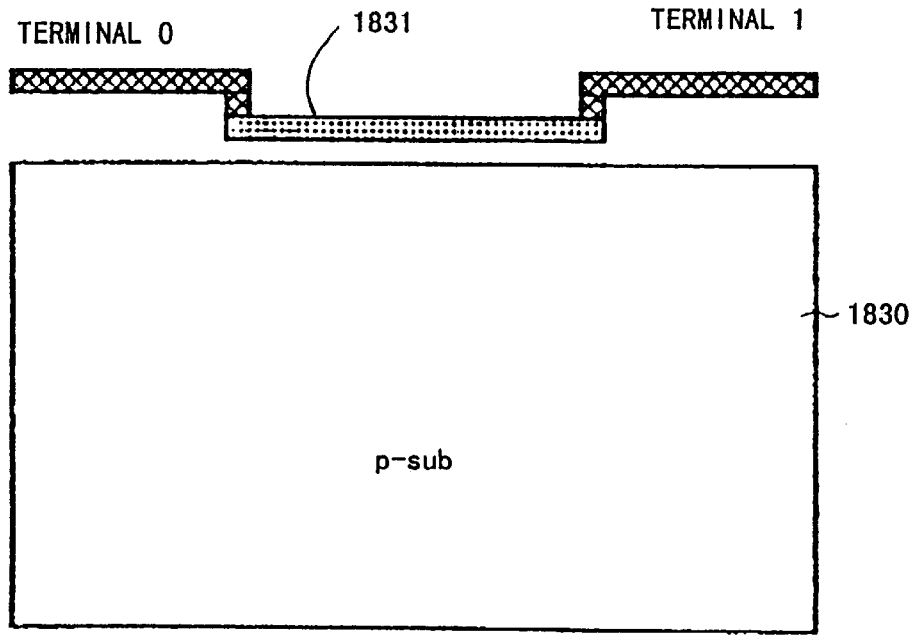
FIG. 19 is a circuit diagram of a polysilicon resistor circuit.
Figure 20:
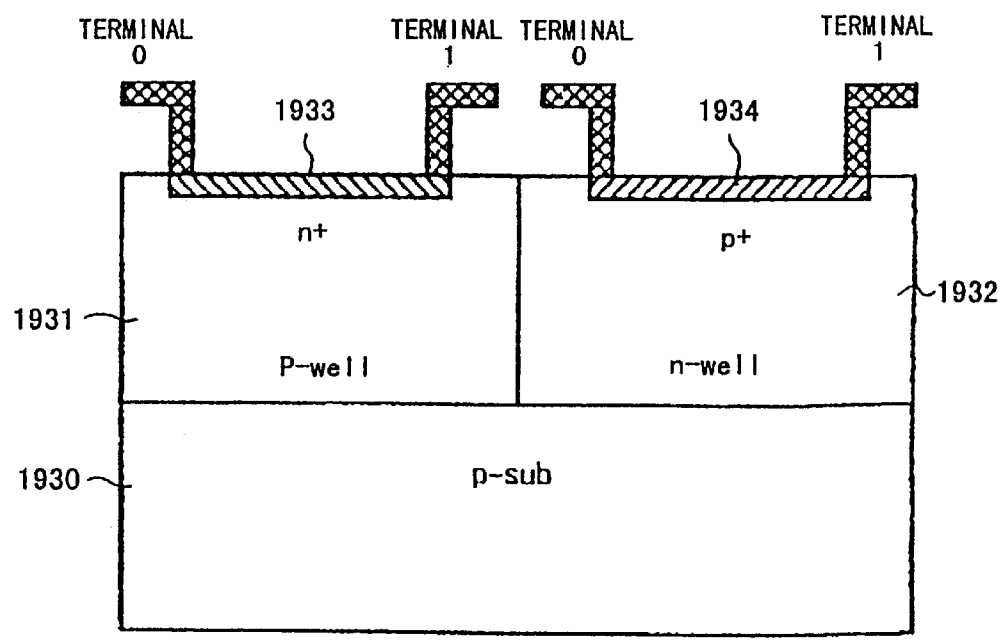
FIG. 20 is a circuit diagram of a diffusion resistor circuit.

FIGS. 18, 19 and 20 illustrate examples of the resistance varying circuit.

In a resistance varying circuit illustrated in FIG. 18, a resistance is comprised of pMOS transistors 1731 and 1733, and nMOS transistors 1732 and 1734. A terminal 0 is a terminal to which a lower level voltage is applied, and a terminal 1 is a terminal to which a higher level voltage is applied. In the pMOS transistor 1731, a reference bias voltage Vrefp is applied to a gate, the terminal 1 is electrically connected to a source terminal, and the terminal 0 is electrically connected to a drain terminal. In the nMOS transistor 1732, a reference bias voltage Vrefn is applied to a gate, the terminal 1 is electrically connected to a source terminal, and the terminal 0 is electrically connected to a drain terminal. In the pMOS transistor 1733, a gate is electrically connected to a drain terminal to which the terminal 0 is electrically connected, and the terminal 1 is electrically connected to a source terminal. In the nMOS transistor 1734, a gate is electrically connected to a drain terminal to which the terminal 0 is electrically connected, and the terminal 1 is electrically connected to a source terminal.

In a resistance varying circuit illustrated in FIG. 19, a resistance is comprised of a layer 1831 composed of polysilicon, and formed on a p-type substrate 1830. A terminal 0 is a terminal to which a lower level voltage is applied, and a terminal 1 is a terminal to which a higher level voltage is applied. The terminal 0 is electrically connected to the polysilicon layer 1831 at one end thereof, and the terminal 1 is electrically connected to the polysilicon layer 1831 at the other end.

In a resistance varying circuit illustrated in FIG. 20, a resistance is comprised of diffusion layers 1931 and 1932. A p-type substrate 1930 includes a p-type well 1931 and an n-type well 1932. A n$^+$ diffusion layer 1933 is formed in the p-type well 1931, and the p$^+$ diffusion layer 1934 is formed in the n-type well 1932. A terminal 0 is a terminal to which a lower level voltage is applied, and a terminal 1 is a terminal to which a higher level voltage is applied. The terminal 0 is electrically connected to the n$^+$ diffusion layer 1933 at one end thereof, and the terminal 1 is electrically connected to the n$^+$ diffusion layer 1933 at the other end. Similarly, the terminal 0 is electrically connected to the p$^+$ diffusion layer 1934 at one end thereof, and the terminal 1 is electrically connected to the p$^+$ diffusion layer 1934 at the other end.

In order to prevent that a current flows between the diffusion layers 1933, 1934 and the p- and n-type wells 1931, 1932, the n-type well 1932 is designed to have a power voltage, and the p-type well 1931 is designed to have a ground voltage. As an alternative, the n-type well 1932 may be designed to have a voltage equal to or greater than a voltage of the p$^+$ diffusion layer 1934, and the p-type well 1931 may be designed to have a voltage equal to or smaller than a voltage of the n$^+$ diffusion layer 1933.

Figure 21A:
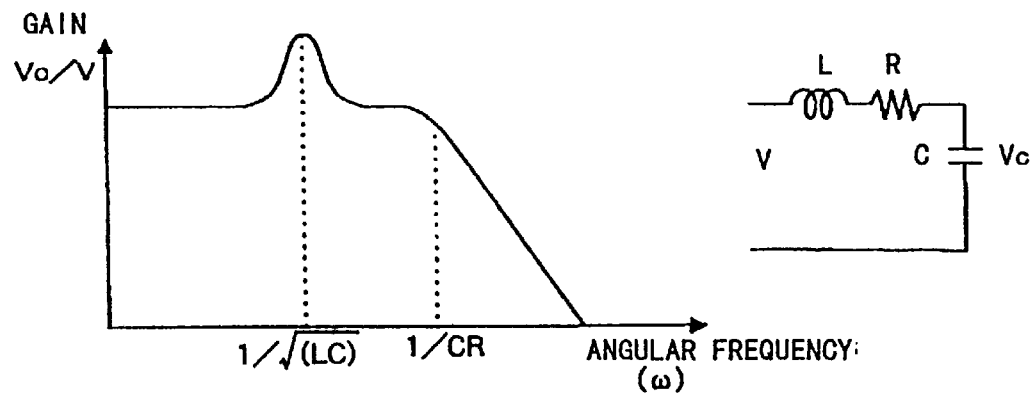
FIGS. 21A and 21B illustrate characteristics of a frequency dependent on a capacitance in a RLC circuit.
Figure 21B:
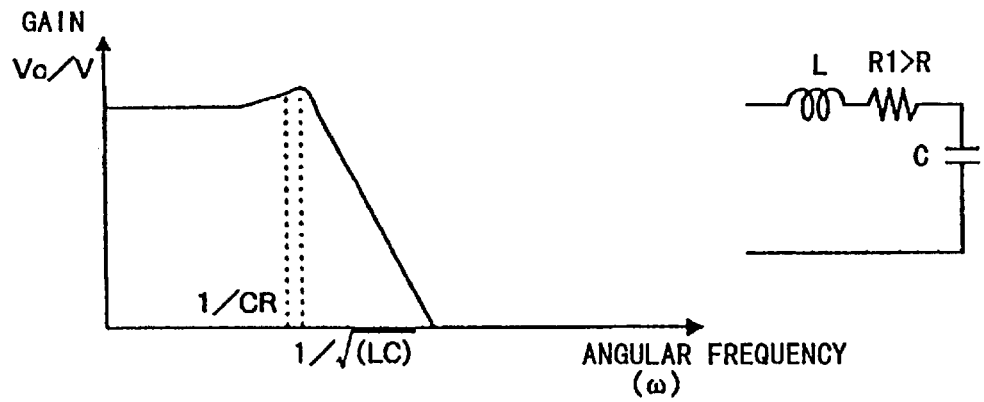

FIGS. 21A and 21B illustrate a frequency characteristic dependent on a resistance in an RLC circuit. A curve representing the frequency characteristic has a resonance point when an angular frequency $\omega$ is equal to $1/(LC)^{1/2}$, and has a peak at the resonance point. The curve is attenuated in a range where an angular frequency $\omega$ is greater than $1/CR$ ($\omega > 1/CR$).

FIG. 21A shows a frequency characteristic of an RLC circuit including a resistance R.

FIG. 21B shows a frequency characteristic of an RLC circuit including a resistance R1 greater than the resistance R of the circuit illustrated in FIG. 21A. As shown in the curve illustrated in FIG. 21B in comparison with FIG. 21A, if an RLC circuit is designed to include a greater resistance, it would be possible to reduce a cut-off angular frequency, and also possible to control a gain.

Figure 22:
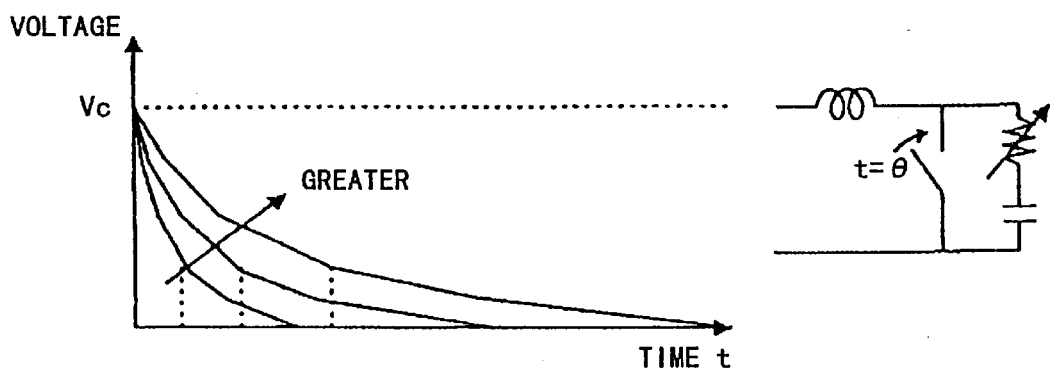
FIG. 22 illustrates a decoupling characteristic of an on-chip decoupling capacitance to which a resistor is connected in series.

FIG. 22 is a graph illustrating a characteristic about discharges from an on-chip decoupling capacitance to which a resistor is connected in series. It is possible to supply requisite charges at a higher speed, as a voltage Vc applied to the RLC circuit approaches zero (0) at a shorter period of time (t). This means the decoupling effect is enhanced. The decoupling effect is reduced, as the resistance R1 becomes greater.

While the present invention has been described in connection with the preferred embodiments, the present invention provides advantages as follows.

The first advantage is that it is possible to reduce power resonance noises. This is because the present invention makes it possible to move a resonance point of a resonance circuit in accordance with an operation frequency, and suppress a gain.

The second advantage is that it is possible to reduce switching noises. This is because the present invention makes it possible to reduce a resistance to be connected to an on-chip capacitance in series, which ensures superior absorption of switching noises.

The third advantage is that a power circuit having a good efficiency can be accomplished. In accordance with the present invention, a resonance point is moved merely out of a frequency and a higher harmonic in each of operation modes. It is no longer necessary to move a resonance point out of an entire, wide range of an operation frequency. Hence, it is possible to hold down a value of a parasitic element associated with a movement of a resonance point to a quite small one, which ensures that a power circuit can be fabricated in a small area.

Thus, in accordance with the present invention, it is now possible to supply low-noise power indispensable for stable operation.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-159773 filed on Jun. 17, 1997 including specification, claims, drawings and summary is incorporated herein by reference in its entirety.

What is claimed is:

1. A parasitic suppression circuit for a power integrated circuit that operates at plural operating frequencies, the parasitic suppression circuit comprising:

a resistance and an inductance for suppressing parasitic in the power integrated circuit;

plural capacitors selectively connected in parallel to each other and to suppress parasitics in the power integrated circuit, said resistance, inductance, and plural capacitors defining an RLC circuit having a resonance point that varies as a function of a number of said plural capacitors that are selectively connected in said RLC circuit;

an operating frequency signal circuit for generating a signal having n-outputs that together are indicative of an operating frequency of the power integrated circuit; and plural first switches selectively connecting said plural capacitors in said RLC circuit, each of said plural first switches being operated by a respective one of said n-outputs and being connected to a respective one of said plural capacitors.

2. The parasitic suppression circuit of claim 1, wherein said inductance comprises plural inductors connected in parallel to each other and plural second switches selectively connecting said plural inductors in said RLC circuit, each of said plural second switches being operated by a respective one of said n-outputs and being connected to a respective one of said plural inductors.

3. The parasitic suppression circuit of claim 1, wherein said resistance comprises plural resistors connected in parallel to each other and plural second switches selectively connecting said plural resistors in said RLC circuit, each of said plural third switches being operated by a respective one of said n-outputs and being connected to a respective one of said plural resistors.

4. The parasitic suppression circuit of claim 1, wherein said operating frequency signal circuit comprises an encoder for receiving an input signal and providing the n-outputs that are bits.

5. The parasitic suppression circuit of claim 1, wherein said plural capacitors have a same capacitance.

6. The parasitic suppression circuit of claim 1, wherein said plural capacitors have different capacitances.

7. The parasitic suppression circuit of claim 1, wherein said operating frequency signal circuit comprises a shift register for receiving an input signal, an internal clock signal and a reference frequency signal, and a register connected to said shift register and to the reference frequency signal for providing the n-outputs.

8. The parasitic suppression circuit of claim 1, wherein said operating frequency signal circuit comprises a counter for receiving an internal clock signal and a reference frequency signal, and a register connected to said counter and to the reference frequency signal for providing the n-outputs.

9. A parasitic suppression circuit for a power integrated circuit that operates at plural operating frequencies, the parasitic suppression circuit comprising:

a resistance and a capacitance for suppressing parasitics in the power integrated circuit;

plural inductors selectively connected in parallel to each other and to suppress parasitic in the power integrated circuit, said resistance, capacitance and plural inductors defining an RLC circuit having a resonance point that varies as a function of a number of said plural inductors that are selectively connected in said RLC circuit;

an operating frequency signal circuit for generating a signal having n-outputs that together are indicative of an operating frequency of the power integrated circuit; and plural first switches selectively connecting said plural inductors in said RLC circuit, each of said plural first switches being operated by a respective one of said n-outputs and being connected to a respective one of said plural inductors.

10. The parasitic suppression circuit of claim 9, wherein said resistance comprises plural resistors connected in parallel to each other and plural second switches selectively connecting said plural resistors in said RLC circuit, each of said plural third switches being operated by a respective one of said n-outputs and being connected to a respective one of said plural resistors.

11. The parasitic suppression circuit of claim 9, wherein said operating frequency signal circuit comprises an encoder for receiving an input signal and providing the n-outputs that are bits.

12. The parasitic suppression circuit of claim 9, wherein said plural inductors have a same inductance.

13. The parasitic suppression circuit of claim 9, wherein said plural inductors have different inductances.

14. The parasitic suppression circuit of claim 9, wherein said operating frequency signal circuit comprises a shift register for receiving an input signal, an internal clock signal and a reference frequency signal, and a register connected to said shift register and to the reference frequency signal for providing the n-outputs.

15. The parasitic suppression circuit of claim 9, wherein said operating frequency signal circuit comprises a counter for receiving an internal clock signal and a reference frequency signal, and a register connected to said counter and to the reference frequency signal for providing the n-outputs.

16. A parasitic suppression circuit for a power integrated circuit that operates at plural operating frequencies, the parasitic suppression circuit comprising:

an inductance and a capacitance for suppressing parasitic in the power integrated circuit;

plural resistors selectively connected in parallel to each other and to suppress parasitic in the power integrated circuit, said inductance, capacitance and plural resistors defining an RLC circuit having a resonance point with a gain that varies as a function of a number of said plural resistors that are selectively connected in said a RLC circuit;

an operating frequency signal circuit for generating a signal having n-outputs that together are indicative of an operating frequency of the power integrated circuit; and plural first switches selectively connecting said plural resistors in said RLC circuit, each of said plural first switches being operated by a respective one of said n-outputs and being connected to a respective one of said plural resistors.

17. The parasitic suppression circuit of claim 16, wherein said operating frequency signal circuit comprises an encoder for receiving an input signal and providing the n-outputs that are bits.

18. The parasitic suppression circuit of claim 16, wherein said plural resistors have a same resistance.

19. The parasitic suppression circuit of claim 16, wherein said plural resistors have different resistances.

20. The parasitic suppression circuit of claim 16, wherein said operating frequency signal circuit comprises a shift register for receiving an input signal, an internal clock signal and a reference frequency signal, and a register connected to said shift register and to the reference frequency signal for providing the n-outputs.

21. The parasitic suppression circuit of claim 16, wherein said operating frequency signal circuit comprises a counter for receiving an internal clock signal and a reference frequency signal, and a register connected to said counter and to the reference frequency signal for providing the n-outputs.

* * * * *